Jan. 8, 1957 A. H. HARGROVE 2,777,061
CRYSTAL CONTROLLED OSCILLATOR
Filed Aug. 6, 1954
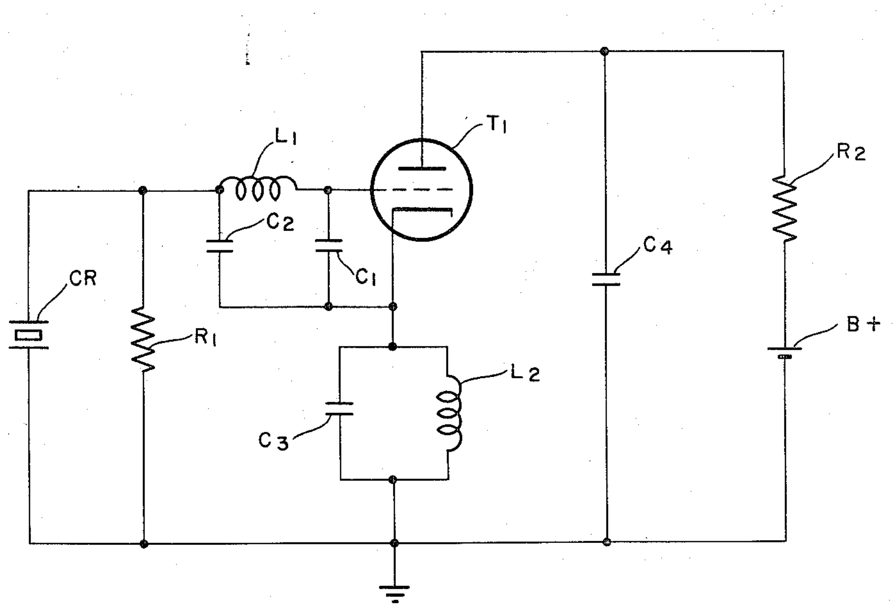
ATWOOD H. HARGROVE
*INVENTOR.*
*BY*
Killman and Kerst
ATTORNEYS United States Patent Office 2,777,061

Patented Jan. 8, 1957

2,777,061

CRYSTAL CONTROLLED OSCILLATOR

Atwood H. Hargrove, Baltimore, Md., assignor to Bendix Aviation Corporation, Towson, Md., a corporation of Delaware Application August 6, 1954, Serial No. 448,183

6 Claims. (Cl. 250—36)

This invention relates to oscillators and in particular to crystal controlled oscillators.

The advantages gained by controlling the frequency of an oscillator by a crystal are well known in the art. The present invention provides an oscillator that permits its frequency of operation to be varied over a frequency range by merely switching crystals.

It is an object of the present invention to provide a crystal controlled oscillator which is frequency controllable over a frequency range by the substitution of crystals.

Another object of the present invention is to provide a crystal controlled oscillator capable of operating at an integer mode of the crystal.

Still another object of this invention is to provide a crystal controlled oscillator in which one of the terminals of the crystal is grounded in a manner such that a convenient method of crystal switching may be employed.

A further object of this invention is to provide a crystal controlled oscillator that requires few components and is compact in size.

A still further object of this invention is to provide a crystal controlled oscillator whose frequency stability is not greatly affected by changing tubes.

Still another object of this invention is to provide a crystal controlled oscillator that presents an inductive load to the crystal so as to prevent loading of the crystal.

These and other objects are realized in an oscillator comprising a crystal, a tube and two parallel tuned circuits. The first tuned circuit is in the cathode circuit of the tube and operates in conjunction with the tube to provide approximately minus ninety degrees phase shift in the feedback loop.

The second parallel tuned circuit is in the grid circuit of the tube and when taken in conjunction with the crystal and a resistor, an additional negative phase shift occurs. The summation of the two phase shifts should equal minus one hundred and eighty degrees.

The crystal operates in a parallel mode but because more than minus ninety degrees are necessary to provide the correct loop phase shift, the frequency of oscillation is slightly different than the frequency dictated by the crystal.

Referring to the drawing, a schematic diagram of a circuit encompassing the invention is depicted.

Referring more particularly to the drawing, a triode vacuum tube $T_1$ has its cathode returned to ground through a parallel circuit comprising a capacitor $C_3$ and an inductor $L_2$. The grid and the cathode of the tube $T_1$ are coupled together by a capacitor $C_1$, which in some applications may consist solely of the interelectrode capacity. An inductor $L_1$ and a capacitor $C_2$ shunt the capacitor $C_1$. The junction of the inductor $L_1$ and the capacitor $C_2$ is returned to ground through a parallel combination of a crystal CR and a resistor $R_1$. A capacitor $C_4$, connected between the plate of the tube $T_1$ and ground, provides an R. F. bypass to ground. A series circuit comprising a current limiting resistor $R_2$ and a D. C. voltage supply $B_+$ is connected between the plate and ground.

The values of the components of the grid parallel circuit are chosen to make the circuit resonate at a frequency greater than the maximum frequency of the frequency range of the oscillator. Consequently, throughout the frequency range, the impedance of this circuit will be inductive.

The values of the components of the cathode parallel circuit are chosen to make the circuit resonate at a frequency less than the minimum frequency of the frequency range of the oscillator. Because of this, the impedance of this circuit will be capacitive throughout the frequency range.

The necessary loop phase shift to produce oscillation is provided by two means. The first means is the combination of the tube $T_1$ and the cathode parallel circuit. This combination effectively appears as a generator with an internal impedance such as to provide in the output signal appearing across the parallel circuit a phase shift approaching minus ninety degrees. The second means is the combination of the grid parallel circuit and the parallel circuit comprising the crystal CR and the resistor $R_1$. This second means provides the additional negative phase shift in the signal applied to the grid to produce oscillation.

In designing for a particular application, the choice of the resonant frequencies of the parallel circuits must be taken into consideration. Because of the particular types of components employed, the phase shift produced by the combination of the cathode parallel circuit and the tube $T_1$ cannot equal nor exceed minus ninety degrees. The degree of the departure from minus ninety degrees is obviously based on the values of the components and the frequency of oscillation.

As stated supra, the second means provides the additional phase shift necessary to produce oscillation. Therefore, this means must produce a phase shift exceeding minus ninety degrees. This is accomplished by the frequency of oscillation being slightly different from the frequency of the mode at which the crystal CR is operating so that the crystal appears reactive.

The present invention provides an oscillator that may be designed to operate on a multiple mode of a crystal. As an example, assume that an oscillator is desired that operates on the third mode of the crystal and that the approximate mid-frequency of the frequency range is 36 mc. A 12 mc. crystal operating at its third mode would then be used to produce this frequency of operation. This immediately places a limitation on the resonant frequency of the cathode parallel circuit in that it cannot exist at a magnitude much less than the frequency of the second mode of the crystal CR as otherwise sufficient phase shift would exist to cause oscillation to occur at the frequency of the second mode.

With 36 mc. as the approximate mid-frequency of the frequency range, the approximate frequency range will be 28 to 42 mc. This will be appreciated when it is realized that the second mode of the crystal necessary to produce 42 mc. is 28 mc. and that this fixes the approximate magnitude of the resonant frequency of the cathode parallel circuit.

The invention is further exemplified by replacing the crystal CR with a parallel tuned circuit. With this substitution, it is obvious that certain desirable characteristics of the oscillator that are attributable to the crystal CR will be eliminated.

What is claimed is:

1. An electronic oscillator comprising: a vacuum tube having a plate, a cathode and a control grid; a source of direct current potential; means joining the positive and negative terminals of said source to said plate and said cathode respectively; a first parallel resonant circuit connected between said cathode and said negative terminal, said circuit being resonant at a frequency below the lowest frequency of operation of said oscillator; a second parallel resonant circuit connected between said grid and said cathode, said second circuit being resonant at a frequency above the highest frequency of operation of said oscillator; a crystal and a resistor; and means connecting said crystal and said resistor in parallel between said second parallel resonant circuit and said negative terminal of said source.

2. An electronic oscillator comprising: a vacuum tube having a plate, a cathode and a control grid; a source of direct current potential; means joining the positive and negative terminals of said source to said plate and said cathode respectively; a first parallel resonant circuit connected between said cathode and said negative terminal, said circuit being resonant at a frequency below the lowest frequency of operation of said oscillator; a second parallel resonant circuit connected between said grid and said cathode, said second circuit, when operating in conjunction with the grid to cathode interelectrode capacity of said tube, being resonant at a frequency above the highest frequency of operation of said oscillator; a crystal and a resistor; and means connecting said crystal and said resistor in parallel between said second parallel resonant circuit and said negative terminal of said source.

3. An electronic oscillator comprising: a vacuum tube having a plate, a cathode and a control grid; a source of direct current potential; means joining the positive and negative terminals of said source to said plate and said cathode respectively; a first parallel resonant circuit connected between said cathode and said negative terminal, said circuit being resonant at a frequency below the lowest frequency of operation of said oscillator; a second parallel resonant circuit connected between said grid and said cathode, said second circuit being resonant at a frequency above the highest frequency of operation of said oscillator; a crystal and a resistor; and means connecting said crystal and said resistor in parallel between said second parallel resonant circuit and said negative terminal of said source, said crystal being so selected that it possesses a mode of parallel resonant operation at approximately the mid-point of the frequnecy range of said oscillator.

4. An electronic oscillator comprising: a vacuum tube having a plate, a cathode and a control grid; a source of direct current potential; means joining the positive and negative terminals of said source to said plate and said cathode respectively; a first parallel resonant circuit connected between said cathode and said negative terminal, a second parallel resonant circuit connected between said grid and said cathode; a crystal connected between said second parallel resonant circuit and said negative terminal and a resistor connected between said second parallel resonant circuit and said negative terminal, said crystal having one of its parallel resonant modes of operation at a frequency which is near the center of the frequency range of oscillation of said oscillator, said first parallel resonant circuit presenting a capacitive impedance throughout the frequency range of said oscillator and said second parallel resonant circuit presenting an inductive impedance throughout the frequency range of said oscillator.

5. An electronic oscillator comprising: a vacuum tube having a plate, a cathode and a control grid; a source of direct current potential; means joining the positive and negative terminals of said source to said plate and said cathode respectively; a first parallel resonant circuit connected between said cathode and said negative terminal, a second parallel resonant circuit connected between said grid and said cathode; a crystal connected between said second parallel resonant circuit and said negative terminal and a resistor connected between said second parallel resonant circuit and said negative terminal, said crystal having one of its parallel resonant modes of operation at a frequency which is near the center of the frequency range of oscillation of said oscillator, said first parallel resonant circuit presenting a capacitive impedance throughout the frequency range of said oscillator and said second parallel resonant circuit, when operating in conjunction with the grid to cathode interelectrode capacity of said tube, presenting an inductive impedance througout the frequency range of said oscillator.

6. An electronic oscillator comprising: a vacuum tube having a plate, a cathode and a control grid; a source of direct current potential; means joining the positive and negative terminals of said source to said plate and said cathode respectively; a first parallel resonant circuit connected between said cathode and said negative terminal; a second parallel resonant circuit connected between said grid and said cathode, and a third parallel resonant circuit connected between said second circuit and said negative terminal, said first circuit being resonant at a frequency below the lowest frequency of operation of said oscillator, said second circuit being resonant at a frequnecy above the highest frequency of operation of said oscillator and said third circuit being resonant at approximately the mid-point of the operating frequency range of said oscillator.

References Cited in the file of this patent

UNITED STATES PATENTS 2,311,163 Edwards ---------------- Feb. 16, 1943